United States Patent [19]

Sauer

[11] 4,340,813

[45] Jul. 20, 1982

[54] SWITCH PANEL WITH TOUCH SWITCHES

[75] Inventor: Gerd Sauer, Aachen-Laurensberg, Fed. Rep. of Germany

[73] Assignee: Saint Gobain Vitrage, Neuilly-sur-Seine, France

[21] Appl. No.: 185,966

[22] Filed: Sep. 9, 1980

[30] Foreign Application Priority Data

Sep. 12, 1979 [DE] Fed. Rep. of Germany ....... 2936815

[51] Int. Cl.³ .............................................. G01D 5/34
[52] U.S. Cl. .................................... 250/221; 250/229
[58] Field of Search ................ 250/221, 229; 350/311, 350/290, 1.1, 1.7

[56] References Cited

U.S. PATENT DOCUMENTS 3,372,789  3/1968  Thiele et al. .

Primary Examiner—David C. Nelms
Assistant Examiner—Darwin R. Hostetter
Attorney, Agent, or Firm—Pennie & Edmonds

[57] ABSTRACT

Switch panel in the form of a glass plate having markings printed thereon to form a switch space. The panel has an opaque layer on the back surface containing windows which are transparent to infrared radiation. A switch sensor responsive to infrared radiation is provided to receive any radiation that may pass through the window from an infrared radiation emitter where the radiation is reflected or dispersed when the switch space is touched.

13 Claims, 4 Drawing Figures

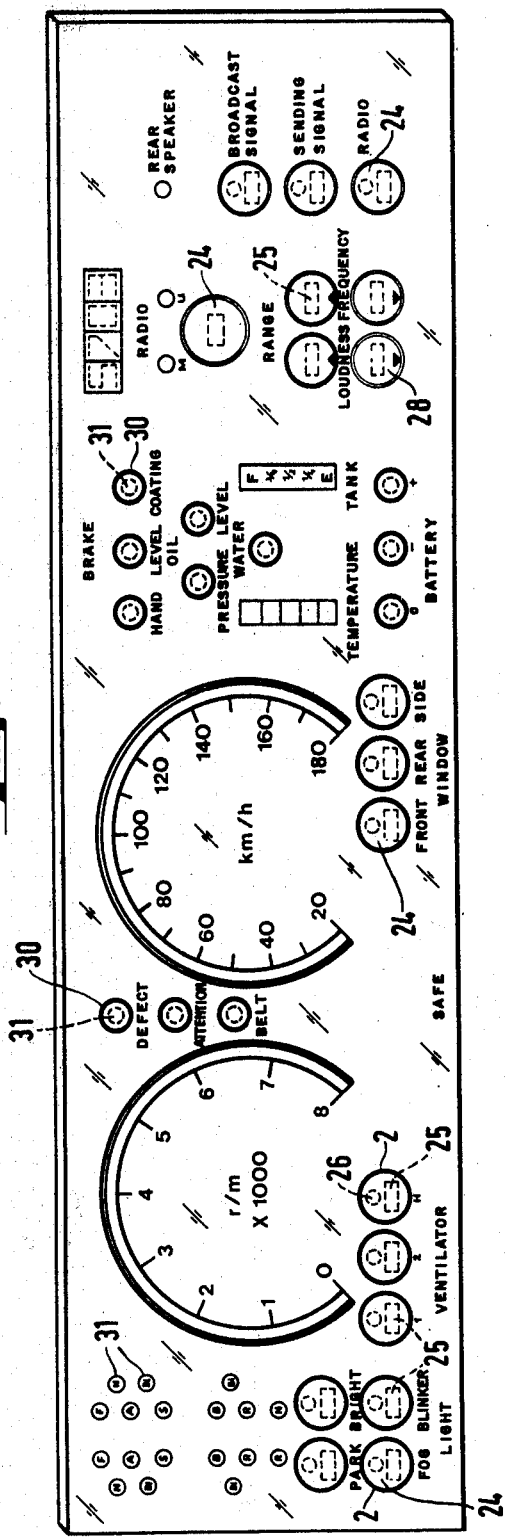

SWITCH PANEL WITH TOUCH SWITCHES

TECHNICAL FIELD

The invention relates to a switch panel comprising a glass plate printed with markings forming switch spaces for touch switches and switch sensors positioned behind the glass plate in the area of the switch spaces.

BACKGROUND ART

Switch panels having switch sensors for touch switches are disclosed in German Disclosure Document AS No. 27 55 678. In the switch panel shown in the disclosure the switch sensors are capacitive touch switches comprising transparent touch plates positioned in front of a glass plate with which rear plates of electrically conductive material are associated at the rear of the glass plate to form capacitors with the touch plates which in turn are connected to a sensing circuit.

In these known switch panels, the transparent touch plates required for the functioning of the touch switches are located in front of the glass plate in the form of thin coats or layers. These thin coats or layers are subjected to wear caused by the touching action. The layers are also directly exposed to the atmosphere of the environment. In particular, if the moisture content of the atmosphere is high or, worse, if moisture precipitates on the glass plates, capacity changes may occur which in turn may trigger unintended switching actions.

It is therefore a purpose of the invention to create a switch panel of the type described above which does not have any switch components on the front of the panel which can be affected by wear or moisture and where the switching sensors will not be affected by atmospheric influences.

DISCLOSURE OF THE INVENTION

Broadly a switch panel constructed according to the invention comprises a glass panel having markings pointed thereon to form switch spaces for touch switches. Switch sensors in the form of semi-conductor elements are located behind the glass plate in the area of the switch spaces with the sensors being responsive to infrared radiation. An infrared emitter is provided to emit radiation through a window towards the plate where the window is transparent to infrared radiation. Radiation is reflected or dispersed when the switch space is touched so that the sensors are actuated by the dispersed radiation.

According to the invention opto-electronic actuating components are used as switching sensors which work according to the principle of electric eyes actuated by reflected light and the switching sensors are therefore completely insensitive to moisture. Switch panels according to the invention are therefore particularly suited for equipment installed in rooms where the atmospheric humidity is high, such as kitchens, laundries, etc., or equipment which for other reasons is exposed to moisture or water.

As there are no openings in the glass plate and no coatings on the front of the glass plate which have an effect on the switching function, protection of the highest degree is ensured for the switching elements against wear and/or chemical corrosion caused by components of the atmosphere.

The switch panel according to the invention may also comprise electro-optical indicating devices which likewise do not require any openings in the glass plate. This permits the extension of the use of the switch panels according to the invention to applications where optical indicating devices are required or useful.

Phototransistors are suitably used as the semiconductor components responding to infrared radiation. In order to reduce the sensitivity of the transistors against external light, a further development of the invention provides that the windows in front of the transistors are provided with a filter which is opaque to visible radiation, but transparent to infrared radiation only. This filter can, for example, be applied on the glass plate by printing.

In order to further increase protection against interference by external light, it may be desirable to modulate the infrared emitters with short pulses of a predetermined frequency and to design the receiving circuit so that it processes only the pulses arriving at the emitted frequency.

The necessary lettering and markings, for example those of the switch spaces, are applied to the front of the glass plate. In order to make these visible in the dark, visible light can be introduced through the edge of the glass plate to generate a "floodlight" effect with the light being dispersed by the letters and markings to partly emerge in the direction toward the observer. According to a further development of the invention, an emitter can be used as a light source for illuminating the edge of the glass plate which generates infrared radiation simultaneously with the visible light so that one emitter is used for generating both the IR radiation used for actuating the sensors and for generating the visible light used for illuminating the markings.

Preferred embodiments of the invention will be described in more detail with the aid of the drawings.

BRIEF DESCRIPTION OF THE DRAWINGS

FIG. 4 is an example of a panel constructed according to the invention used in an instrument panel for an automobile.

BEST MODES FOR CARRYING OUT THE INVENTION

Figure 1:
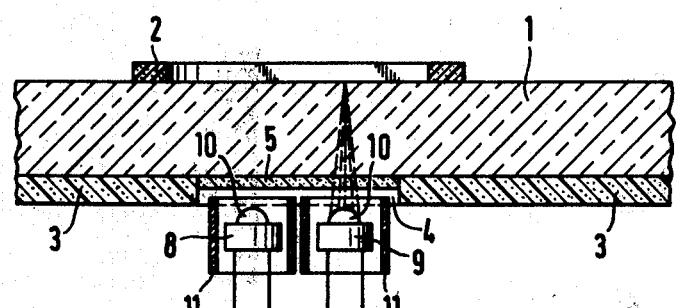
FIG. 1 is a cross section through a switch panel constructed according to the invention in the area of a switch space with a phototransistor and an emitting diode being used as an IR receiver and IR emitter, respectively.

Referring to FIG. 1, the switch panel comprises a plate 1 of silicate glass which is preferably thermally prestressed in order to increase its impact and flexural strength. Markings 2 are on the side of the panel facing an observer and comprise a frame forming a switch space on the glass plate which must be touched in order to trigger the desired switching operation. Markings 2 preferably comprise a white baked varnish.

The plate has an opaque layer 3 on its rear surface where the layer 1 is interrupted within the switch space formed by marking 2 to form a window 4 through which the infrared radiation can pass. A filtering layer 5 which is opaque to visible light but which permits unimpeded passage of IR radiation is placed within the area of window 4. A commercially available silver or yellow stain is suitable for producing a usable filtering layer because of its special transmission characteristic.

Filtering layer 5, layer 3 which is opaque to light, and markings 2 are made from commercially available printing colors and printed, for example, by means of screen printing onto the cold glass plate. After the printed colors have dried, they are baked onto the glass plate in a heat treating process. It is desirable to choose baking colors which are baked at temperatures of approximately 600° C. A white ceramic baking color, for example, is used for marking 2 which is sold by the DEGUSSA Company under catalog number 19710. For the opaque layer 3 on the rear surface of the glass plate, a dull black baking color made by BLYTHE COLOURS N.V. is used, which is sold under catalog number 39 307. For producing the filtering layer 5, a printable silver stain, sold by the DEGUSSA Company under catalog number 73 008 is used. In order to bake the colors onto the glass plate, the plate is heated to a prestressing temperature and then rapidly cooled by a stream of air or another cooling medium resulting in the glass plate being prestressed.

A receiving transistor or switch sensor 8, which is sensitive to IR radiation and an emitting diode 9 which emits IR radiation are placed side by side behind the filtering layer 5. Transistor 8 and diode 9 each are each equipped with a small lens 10 to ensure that radiation emitted by the emitting diode is in a narrow beam and that the receiving transistor only senses radiation arriving in a perpendicular direction. Lens 10 is arranged in such a manner that it focuses the IR radiation of emitting diode 9 so that the focal point of the IR radiation is approximately in the touch plane of its glass plate but in no case further from the plane than just above the front surface of the glass. The purpose of focusing the IR radiation is to reduce the density of radiation outside the switch panel to such an extent that any unintended actuation of a receiving transistor is prevented in case of unintentional approach to the switch. The emitting and receiving directions, respectively, of receiving transistor 8 and emitting diode 9 are perpendicular to glass plate 1 and the distance between these devices is large enough to ensure that no coupling of the IR radiation by reflection from the filtering layer 5 or the surfaces of glass plate 1 can take place. Small tubes 11, made of a material which is opaque to IR radiation, are placed around transistor 8 and diode 9 in in order to prevent direct lateral irradiation of the transistor or sensor.

In order to prevent unintended actuation of a switch sensor 8 caused by any dispersion of IR radiation emitted by the emitting diode due to the markings 2, the markings 2 surrounding a switch space are located outside the area covered by the emitting diode or the receiving transistor. This means that the internal diameter of the markings 2 is larger than the diameter of a window 4 in opaque layer 3.

Figure 2:
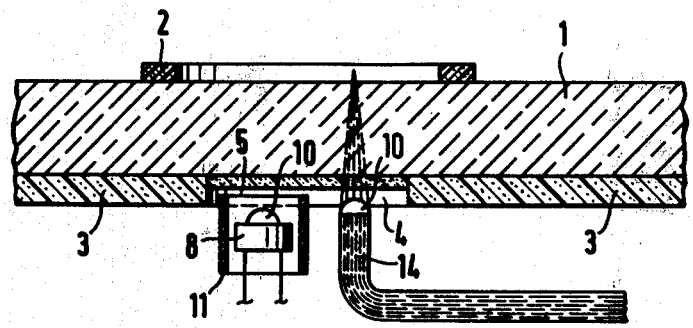
FIG. 2 is a further embodiment of the panel shown in FIG. 1, in which the IR radiation is directed to the glass plate through an optical wave guide.

Referring to FIG. 2, a further embodiment is shown in which the switch space is basically of the same design as the one described in FIG. 1. The switch sensor again comprises a receiving transistor 8 with an optical lens 10 and a protective tube 11 surrounding it. However in this embodiment, an optical wave guide 14 leading to a central IR radiation emitter is provided for bringing the IR radiation to the switch space.

Figure 3:
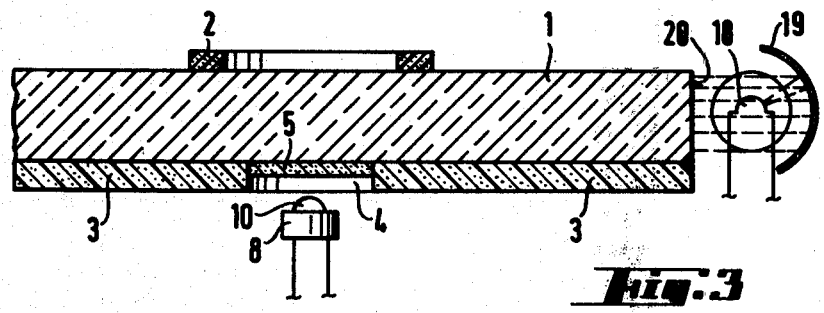
FIG. 3 is a still further embodiment of the panel shown in FIG. 1 in which the IR radiation enters through an edge of the glass plate.

The embodiment shown in FIG. 3 also includes a central IR radiation emitter. In this case, however, the IR radiation is not directed to the switch space perpendicularly through window 4 as in the embodiments of FIGS. 1 and 2, but enters through a lateral edge 20 of the glass plate 1 from emitter 18 and from a reflector 19 placed behind the emitter. A radiation generator is used as emitter 18 which radiates a wide spectrum of radiation and which generates visible light in addition to the infrared light which is required for actuating the receiving transistors 8. This infrared radiation is dispersed when a finger is placed on the switching area and then sensed by the receiving transistor. The visible light ensures a "floodlight" illumination of markings 2 which become visible to the observer due to the dispersion of the light rays on the imprinted markings so that external illumination of the switch panel is unnecessary.

The IR radiation emitters, regardless of their design, are modulated with very short pulses, only a few microseconds long, of a given frequency with the result that they emit IR flashes with relatively high energy. The receiving circuit connected to the receiving transistors is designed in such a way that it responds only to pulses with the emitter frequency. This construction further contributes to the protection against external light inadvertently actuating a switch sensor.

An indicating device in the shape of an electric or electronic light signal can be provided at the rear surface of the glass plate within the space formed by the markings in addition to the switching sensor itself and an IR emitter which may be required at this point. By this combination of switching sensor and indicating device or signal lamp, a particularly simple and effective indication of the status of the switch is ensured.

Referring to FIG. 4, there is shown an example of a preferred application of a switch panel constructed according to the invention utilized as an instrument panel for an automobile. The instrument panel comprises several switch spaces 24 equipped with switch sensors as described above and used for operating various electrical devices, such as lights, fan, windscreen heater, radio, etc. The rectangular area 25 in the switch spaces 24 depicts a window in the opaque layer behind the glass plate. A receiving transistor and a IR, not shown, are in turn located behind each window. Within the switch space 24 surrounded by the markings 2, there is also provided, a smaller round window 26 located above the window 25 and behind which there is placed an electrical or electronic light signal to indicate the switch status.

For switch actions in which optical indication is not necessary, as for example frequency and volume controls of a radio receiver, the switch spaces 28 contain merely the switch sensor. Also there may be provided a number of circular markings 30 on the front of the glass plate within which there are indicated smaller circular windows 31 in the opaque layer on the back of the glass plate and behind which only signal lights are positioned. These lights are independent of switch sensors and are used to indicate the status of various switches which are influenced by other switches or sensors, or for example, oil pressure and temperature warning lights.

I claim:

1. Switch panel comprising a glass plate having markings printed on a surface thereof to form switch spaces for sensors located behind the glass plate in the areas of the switch spaces, characterized in that the switch sensors comprise semi-conductor elements responsive to infrared radiation, in that windows transparent to infrared radiation are provided between the switch sensors and the switch spaces, in that the glass plate has a dull opaque layer on a rear surface thereof which is impermeable to light, in that said windows comprise openings formed in said opaque layer, in that a filter layer comprising a printed silver stain is positioned on the rear surface of the glass plate within the area of said windows and which is transparent to infrared radiation, and in that an emitter is provided which emits infrared radiation through a window towards the glass plate with said radiation being reflected or disbursed when the switch space is touched to activate the switch sensors by reflected or disbursed radiation.

2. Switch panel according to claim 1 further chacterized in that the markings forming the switch spaces are printed on a front surface of the glass plate.

3. Switch panel according to claim 2, further characterized in that the markings comprise a white baked enamel.

4. Switch panel according to claim 1, further characterized in that the glass plate comprises a thermally prestressed silicate glass and in that the markings, the opaque layer and the filter layer are baked on the glass plate during the heat treatment required for prestressing the glass plate.

5. Switch panel according to claim 1, further characterized in that the switch sensors are phototransistors which are sensitive to infrared radiation.

6. Switch panel according to claim 1, further characterized in that the emitter comprises an emitting diode which is associated with a switch sensor and which is located within the area of sensor window next to a corresponding semiconductor element.

7. Switch panel according to claim 1, including a plurality of switch sensors and further characterized in that the emitter comprises a central IR radiation emitter with the IR radiation being brought to an appropriate sensor window by means of an optical wave guide.

8. Switch panel according to claim 1 including a plurality of switch sensors and further characterized in that the emitter comprises a central IR radiation emitter placed at one edge of the glass plate which radiates IR radiation into the glass plate and where the plate serves as an optical wave guide.

9. Switch panel according to claims 6 or 7, further characterized in that the infrared emitter has a lens which focuses the IR radiation such that the focus is located substantially on the front surface of the glass plate or a few millimeters in front of the front surface.

10. Switch panel according to claim 1, further characterized in that the emitter emits modulated short pulsed, IR flashes with relatively high energy at a predetermined emitting frequency and in having a receiving circuit controlled by the switch sensors adopted to receive only pulses at the emitting frequency.

11. Switch panel according to claim 1, further characterized in that said emitter is located laterally of an edge of the glass plate and emits visible light which enters the glass plate and which is dispersed by the markings and then leaves the glass plate making the markings visible.

12. Switch panel according to claim 1, further chacterized in that said opaque layer has openings for electrooptical indicating devices.

13. Switch panel according to claim 12, further characterized in that the openings are located within the switch spaces defined by the markings.

* * * * *